United States Patent [19]

Baldwin

[11] 4,004,218
[45] Jan. 18, 1977

[54] DEVICE FOR DISPLAYING ANALOG SIGNALS ON A RASTER SCANNING DISPLAY

[76] Inventor: George H. Baldwin, 1764 Waterdown Road, Burlington, Ontario, Canada, L7R3X5

[22] Filed: Jan. 22, 1975

[21] Appl. No.: 543,067

[52] U.S. Cl. .................. 324/57 SS; 178/DIG. 4; 325/363
[51] Int. Cl.² .................................. G01R 27/00
[58] Field of Search .......... 324/57 SS, 57 R, 57 Q; 325/363; 178/DIG. 4, 6, 8; 340/324 A

[56] References Cited
UNITED STATES PATENTS

| | | | |
|---|---|---|---|
| 2,293,135 | 8/1942 | Hallmark | 324/57 Q |
| 2,714,657 | 8/1955 | Stein | 325/363 |
| 3,622,889 | 11/1971 | Ridolfi | 324/57 Q X |
| 3,659,044 | 4/1972 | Olson | 178/DIG. 4 X |

*Primary Examiner*—Stanley T. Krawczewicz
*Attorney, Agent, or Firm*—K. M. Hill

[57] ABSTRACT

Television or other raster display system for displaying the waveform of a time-varying input signal. The scanlines of the raster scan-line pattern are traced on the display screen in a direction orthogonal to the direction of movement of the waveform. The waveform image is constructed on the display screen by superimposing a dot on each raster scanline. These dots are developed by comparing the instantaneous value of the time varying input signal with the instantaneous value of a ramp signal which is synchronized with the raster scanlines.

8 Claims, 12 Drawing Figures

DEVICE FOR DISPLAYING ANALOG SIGNALS ON A RASTER SCANNING DISPLAY

The disclosure covers an improved circuit for comparing the time-varying signal and the ramp signal. It also covers improved circuit combinations for displaying:
resonance curves; transistor curves;
a spectrum of signals
low frequency signals

BACKGROUND OF THE INVENTION

Other instruments have used the combination of a comparator and a television type display to display time-varying signals. Some sophisticated devices convert analog signals to digital, store the digital signals in a memory then use them in a timed sequence to create images on a television type display.

Sophisticated displays have found application in fields of science, medicine and commerce. There are other fields where simple devices would be useful. On such field is test equipment used by service technicians when repairing television receivers and other electronic equipment.

For example, to align the tuned intermediate frequency amplifier circuits of a television receiver, the recommended equipment includes a oscilloscope, a sweep signal generator, a marker generator, a marker-adder. The recommended procedure calls for interconnections between these instruments and the television receiver being aligned. It also calls for phasing and synchronizing adjustments between these instruments and successive changes of connections between the test equipment and the receiver being aligned.

The invention described herein is designed to improve and simplify the alignment of television receivers and be useful in other fields where a simple display is adequate. In the prior patents the common characteristics are:

a. a television type raster display including a video amplifier and a frame synchronization circuit.

b. a first time-varying signal which is to have its waveform displayed.

c. a comparator which has the first time-varying signal applied to it and which also has a second time-varying signal applied to it, the second time-varying signal being synchronized with the scanlines in the television type display.

A major difference between the previous devices is in the type of comparator used.

SUMMARY OF THE INVENTION

The present invention uses a comparator which differs from previous practice in this field. This comparator lends itself to simplification. One version of the invention which is intended for alignment of tuned circuits, displays simultaneously: the response curve, vertical and horizontal co-ordinate lines and four calibration markers. Also in this version a switch is provided to activate a gate and allow only a segment of the swept frequency to reach the circuit under the test and appear on the display with the co-ordinate lines and markers. This facilitates trap adjustments.

This version of the invention is a compact instrument small enough to fit in one end of a brief case. When used to align the intermediate frequency circuits of a television receiver, the display may be made to appear on the screen of the receiver being tested. The size of the display is limited only by the size of television screen being used. The display can be blown up to emphasize selected segments such as trap areas.

This version of the invention includes the functions of a two channel oscilloscope with co-ordinate lines, a sweep signal generator, a four-marker generator and a spot signal generator.

Another version of the invention is a spectrum display. This includes a signal detector, a swept frequency heterodyne oscillator, a broad band intermediate frequency amplifier, signals for co-ordinate lines, marker calibration circuit, a second detector, one comparator for the marker display, a second comparator for display of the spectrum signals and a conventional television receiver or monitor.

A third version displays a family of curves of non-linear devices such as transistors. This version includes a staircase signal generator, a ramp signal generator, horizontal and vertical co-ordinate signals, a comparator and a television type raster display.

A fourth version displays low frequency signals. This version includes a variable oscillator covering the range from approximately 5 HZ below to 5 HZ above 60 HZ, a gate circuit activated by said variable oscillator to control the signals of the displayed waveform, horizontal and vertical line signals, a comparator and a television type raster display. Activating the variable oscillator and gate reduces the zero line of the display to a slowly moving spot. Adjusting the variable oscillator frequency causes the spot to stop or reverse. The variable oscillator may be adjusted so that the displayed spot traverses the screen approximately once every six seconds. If now a time-varying signal corresponding to heart-beats is applied to the comparator, the spot will trace out a display of the waveform of seven heart beat signals.

A particular feature of the invention, in all its versions, is that the displays can be photographed with the simplest camera.

Another feature is the size of the display compared to most oscilloscopes.

DETAILED DESCRIPTION OF THE INVENTION

Resonance Display Circuit – herein called the first version.

Figure 1:
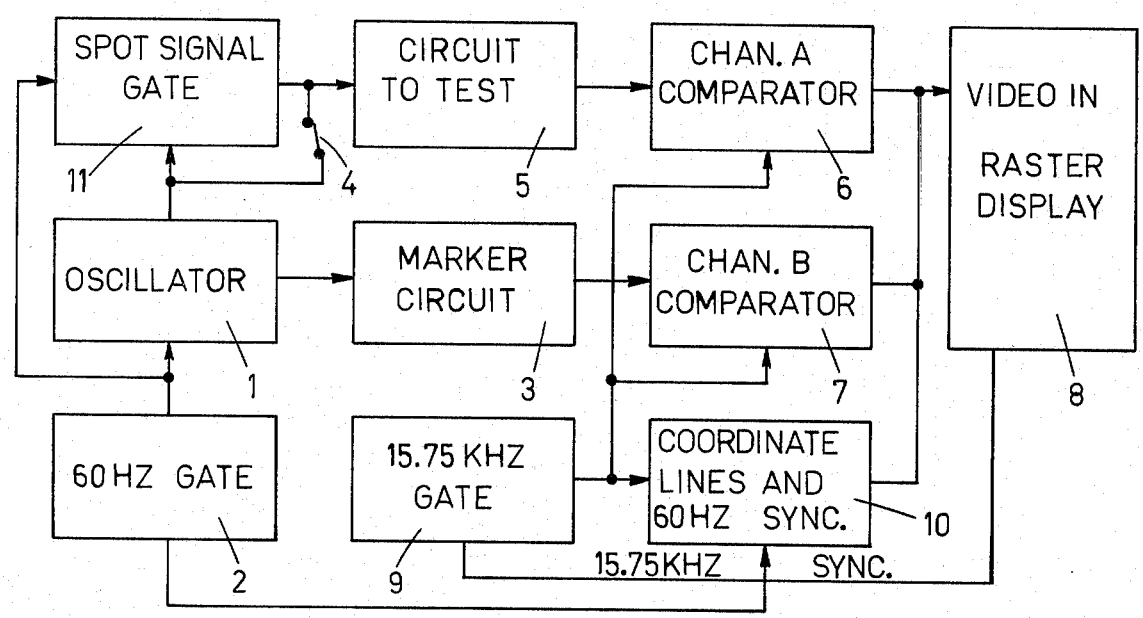
FIG. 1 is a block diagram of a display system for alignment of tuned circuits in accordance with this invention.

FIG. 1 is a block diagram of the invention as used for displaying the resonance curve of a tuned circuit. This version of the invention will be described in detail. The other versions and modifications will then be described in relation to this first version.

In this description use will be made of specific values which are associated with the NTSC system of television and the standard 60 HZ power distribution system. Application of this invention to other television, power and raster scanning systems will be obvious. FIG. 1 shows a sweep oscillator 1. The frequency output of this oscillator varies over a range substantially greater than the tuned circuits to be tested. Commonly such sweep oscillators include a tuned circuit comprising an inductance and a capacitance. Either the inductance or the capacitance may be varied to change the oscillator frequency. It is convenient but not essential to vary the inductance manually to control the centering of the swept frequency. Also it is convenient to use a varactor capacitor as a part of the oscillator tuned circuit. The capacitance of this varactor is controlled by a bias voltage. The bias voltage applied to the varactor can be a ramp with a repetition frequency of 60 HZ. The ramp need not be linear with respect to time. By proper choice of exponential shape for the ramp voltage, the output frequency of the oscillator can be made to sweep in incremental steps which are proportional to time.

Also shown in FIG. 1 is a 60 HZ gate 2 which controls the repetition rate of the sweep oscillator ramp. The output of the sweep oscillator is fed directly to the marker circuits 3 and through switch 4 to the circuit 5 which is being tested for resonance. The circuit to be tested must terminate in a rectifier to develop a 60 HZ signal which is fed to channel A comparator 6. The marker circuits are conventional. Because the markers are displayed separately from the resonance display it is convenient to show several simultaneously. It is not essential to rectify the marker signals but improved definition is secured by rectifying these marker signals. The marker signals are fed to channel B comparator 7. The pulses from both comparators are fed to the raster display 8.

A 15.75 KHZ gate 9 is shown in FIG. 1 as controlling both comparators. This will be explained below.

FIG. 1 also shows a block 10 which represents a 60 HZ synchronizing pulse shaper and circuits to produce pulses which create co-ordinate lines on the display. The co-ordinate line pulses are shown controlled by the same gates as control the ramps in the comparators and the display repetition. This will be further explained in the description of the comparators and the co-ordinate lines.

When switch 4 in FIG. 1 is opened the spot signal gate 11 is activated. The function of this gate is to suppress all of the sweep oscillator signal to the circuit under test except for a selected segment of the sweep band. This function can be secured in a variety of ways. One way is to insert a buffer amplifier between the sweep oscillator and the test circuit and bias the buffer to cut-off. Now if a 60 HZ pulse under manually adjustable phase control is applied to the buffer the sweep signal will reach the test circuit for a short portion of each sweep of the oscillator. The function of this gate is to allow the sweep oscillator to do the work of a single-frequency generator.

THE UNIJUNCTION COMPARATOR

Figure 2:
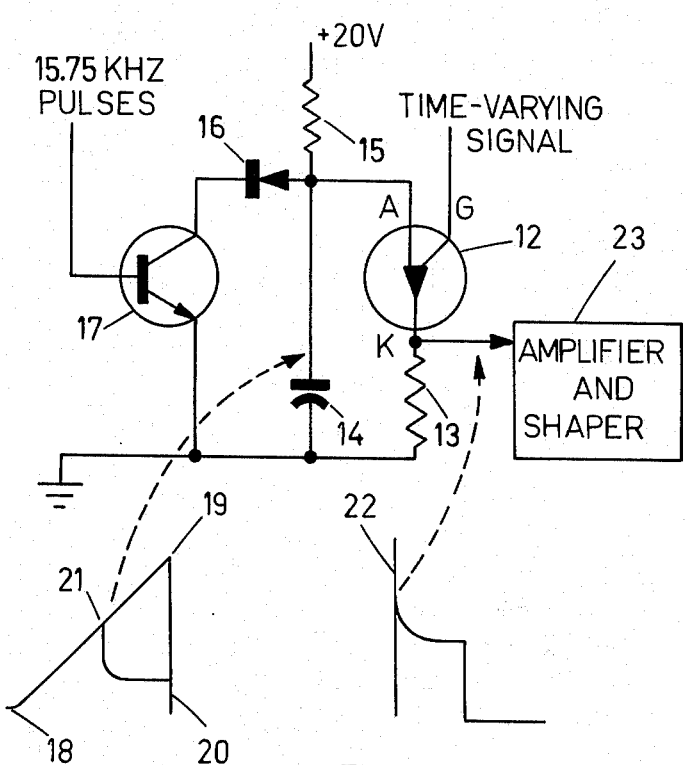
FIG. 2 is a detail schematic of the type of comparator which is claimed in this invention and a 15.75 KHZ gate.

In FIG. 2 one component is a programmable unijunction transistor 12. It is subjected to a ramp signal on the anode (A) and a time-varying signal on the gate (G). The interaction of these voltages determines if and when any current flows through the cathode (K) of the unijunction and the resistor 13.

A conventional ramp voltage is provided by slowly charging capacitor 14 through resistor 15 and discharging it suddenly through isolation diode 16 and transistor 17. Transistor 17 is periodically made conductive by 15.75 KHZ pulses. The shape of this ramp is indicated by the waveform 18, 19, 20.

The unijunction 12 constitutes an alternative path to discharge the voltage on capacitor 14. If the voltage on gate (G) of the unijunction is low enough, there will be a point 21 between 18 and 19 where the unijunction 12 becomes conductive and suddenly discharges part of the charge on capacitor 14 causing a steep pulse on the waveform 22 of voltage across resistor 13. The phase of the unijunction discharge point 21 determines the position of the pulsed dot on the corresponding raster scan-line. Further amplification and shaping is provided by conventional circuits in box 23.

The particular characteristics of the unijunction that make it effective in this application are:

a. the steepness of the initial discharge results in easily shaped strong, sharp pulses which create small dots with well defined contrast on the raster display.

b. after the initial sudden discharge, through unijunction 12, the unijunction remains partially conductive until the voltage on anode (A) reaches zero at the bottom of the ramp. This conduction automatically inhibits a second rise of voltage on capacitor 14 which otherwise might trigger a second discharge of the unijunction and a double image on the display.

c. the circuits used require only low voltages.

d. when isolating diodes 16 are used two or more comparators can be synchronized by one gate transistor 17.

e. the proportion of the ramp 18, 19 that may be used to trigger the unijunction is quite large, permitting large images to appear on the display.

Figure 3:
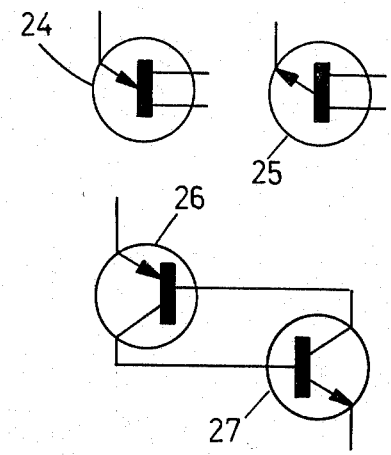
FIG. 3 shows the conventional symbols of three alternative components which are known equivalents to the programmable unijunction 12 in FIG. 2.

FIG. 2 shows a programmable unijunction 12. This circuit may also be used with either of three recognized alternatives. FIG. 3 shows these alternatives: a standard unijunction 24 a complementary unijunction 25 and a complementary pair of transistors 26, 27.

PRODUCTION OF CO-ORDINATE LINES AND RELATED FUNCTIONS

Figure 4:
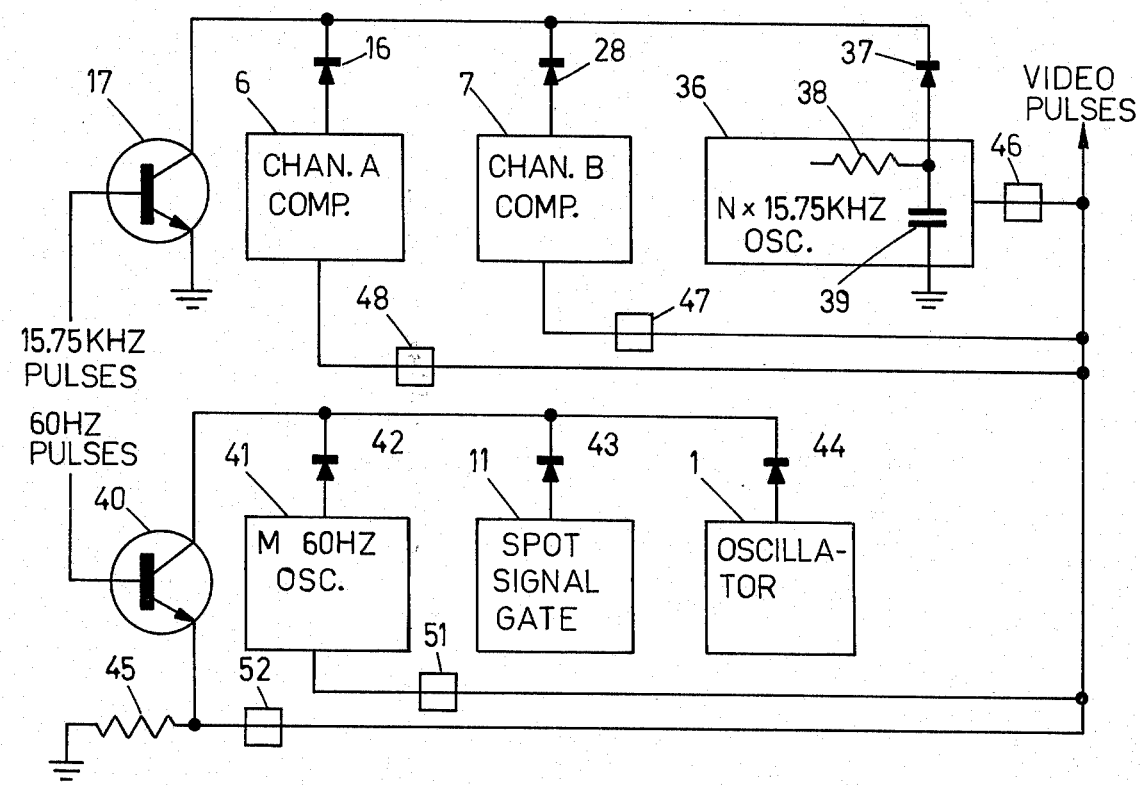
FIG. 4 is a block diagram of the gate circuits used to produce electronic pulses that create co-ordinate lines on the display and also provide synchronization.

FIG. 4 shows two comparators 6, 7, like FIG. 2 controlled by common 15.75 KHZ gate transistor 17. They are isolated from each other by diodes 16 and 28. Also controlled by the same gate is relaxation oscillator 36 with which is used another isolation diode 37. If it is desired to have five co-ordinate lines orthogonal to the scanlines, the relaxation oscillator 36 would be adjusted to operate at a free rate of approximately 6 × 15.75 KHZ (94.5 KHZ). After completing five cycles of its free rate the relaxiation oscillator is short-circuited through gate transistor 17 and starts over again. Each cycle of the relaxation oscillator 36 creates a pulse. These pulses are fed to the raster display means and create five dots on each scanline, forming five lines orthogonal to the scanlines. The relaxation oscillator could be of various types. One type could be a conventional trigger diode type with ramp-forming resistor 38 and ramp capacitor 39.

The lower half of FIG. 4 shows a group of circuits operating together in a similar manner to the group just described. Transistor 40 is a common gate operating at 60 HZ to simultaneously short-circuit the circuits in three adjoining blocks.

Block 41 is a relaxation oscillator similar to block 36. It could be a unijunction type. If it is desired to have 22 co-ordinate lines, the free-running frequency should be somewhat higher than 22 × 60 HZ. (=1320 HZ) the pulses from this oscillator should be shaped by conventional means to have a duration period greater than the period of one scan line. These pulses will then emphasize or suppress 22 equally spaced scan-lines and produce 22 co-ordinate lines on the display parallel to the scan lines. Diodes 42, 43, 44 isolate the functions in blocks 41, 11, 1 during their respective charging periods.

Block 11 represents the spot signal gate. It could consist of a ramp capacitor charged through a variable resistor and discharged through a silicon switch to develop a pulse on a buffer transistor and permit a segment of the sweep frequency to reach the test circuit. The 60 HZ gate 40 would discharge this ramp capacitor in synchronism with the ramp capacitor in the relaxation oscillator 41.

Block 1 represents the sweep signal oscillator. This also could include a ramp capacitor charged through a resistor. In this oscillator the instantaneous voltage on the ramp capacitor could be used to vary the bias on a varactor capacitor and change the frequency of the oscillator over the desired sweep range.

Resistor 45 in the discharge path of transistor 40 develops a voltage which could be used to synchronize the frame repetition rate of the television-type display.

Components 46, 47, 48, 51, 52 are conventional diodes or resistors permitting the various pulses to have independent shaping circuits.

The electronically produced co-ordinates have the following characteristics:

a. they fit any size display.
b. no parallax.
c. the ordinates are uniformly spaced in time and may be used to correctly measure values on a curve even if the raster is distorted.

Figure 5:
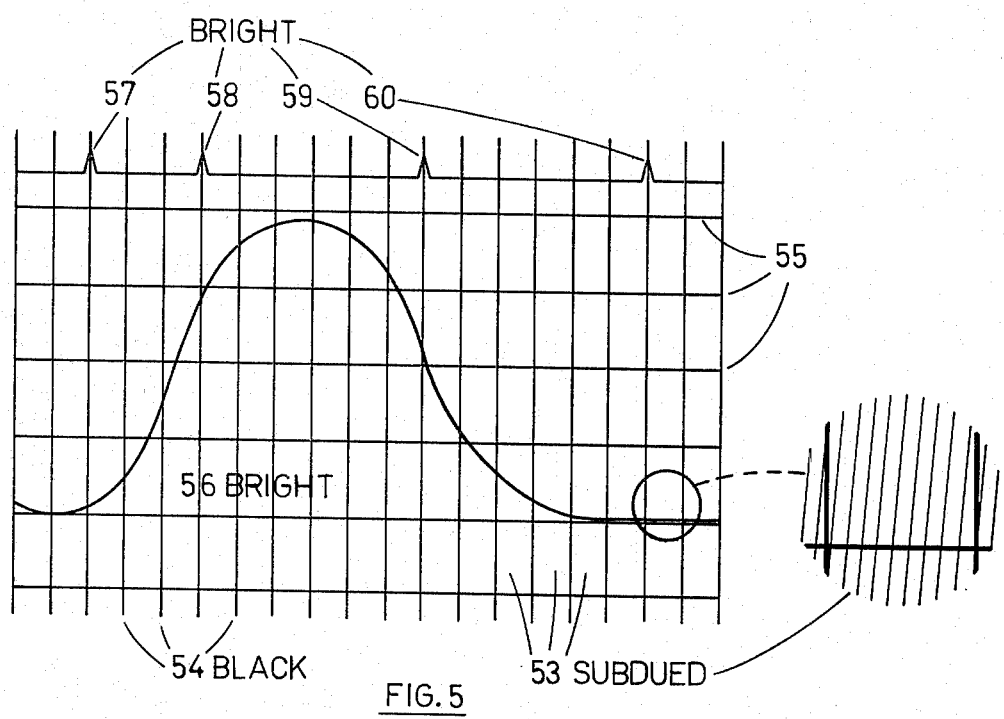
FIG. 5 is a representation of the display surface showing an alignment waveform, markers and co-ordinate lines.

FIG. 5 is a representation of the display screen. The scanlines are shown traversing the display vertically. The scanlines form the lightly shaped rectangles 53. Parallel to the scanlines are 20 co-ordinates lines 54. Orthogonal to the scanlines are five co-ordinate lines 55. A resonance curve 56 is displayed, also four calibration markers 57, 58, 59, 60. In this case the markers are developed by using crystals operated at 42.25 45.75 and 39.75 MHZ respectively. Between 42.75 and 45.57 MHZ is a difference of 3 MHZ. Between the markers 42.75 and 45.75 are six co-ordinate spaces. Between the other markers the same spacing ratio exists. Each co-ordinate space between the markers, represents 0.5 MHZ. This indicates the convenience and feasibility of designing for a linear, easily interpreted calibration.

Figure 6:
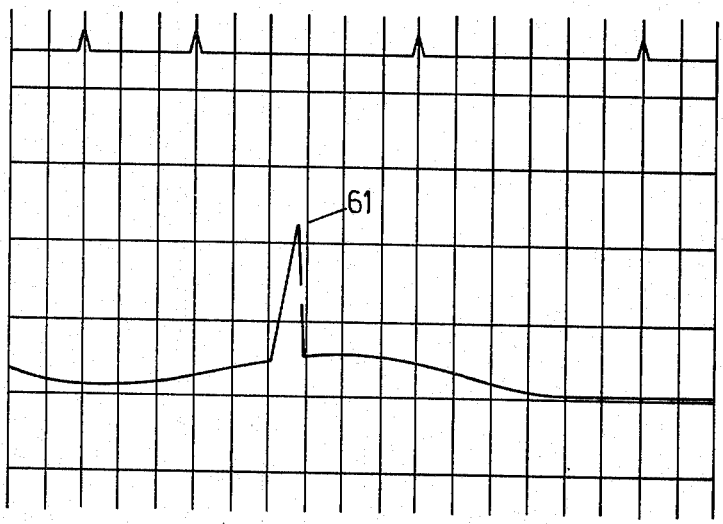
FIG. 6 is the same as FIG. 5 except it shows the waveform when a gate is used to select a segment of the swept frequency.

FIG. 6 is similar to FIG. 5 but shows a segment 61 of the resonance curve as developed by the spot signal gate 11. All displays on this screen are developed by dots superimposed on the scanlines. Normally a displayed curve is represented by only one dot per scanline per frame of the display. The segment 61 spans approximately seven scanlines. If the scanline frequency was locked to an integral multiple of the raster frame frequency, the scanlines of successive frames would be superimposed on each other and segment display 61 would be represented by only seven stationary dots. If however, the frequency relationship between scanline repetition and raster frame repetition is random, the scanlines of successive frames will move in a direction orthogonal to the scanlines. Due to retention of vision the eye will see more than seven dots tracing the curve 61. This makes the display more useful. If the display FIG. 6 were photographed with 1/10 second exposure, it would register 1/10 of 60 successive frames—that is six frames. In each frame the seven dots of curve 61 might occupy different positions. The resultant photograph could show 6 × 7 = 42 dots defining the display 61.

Figure 7:
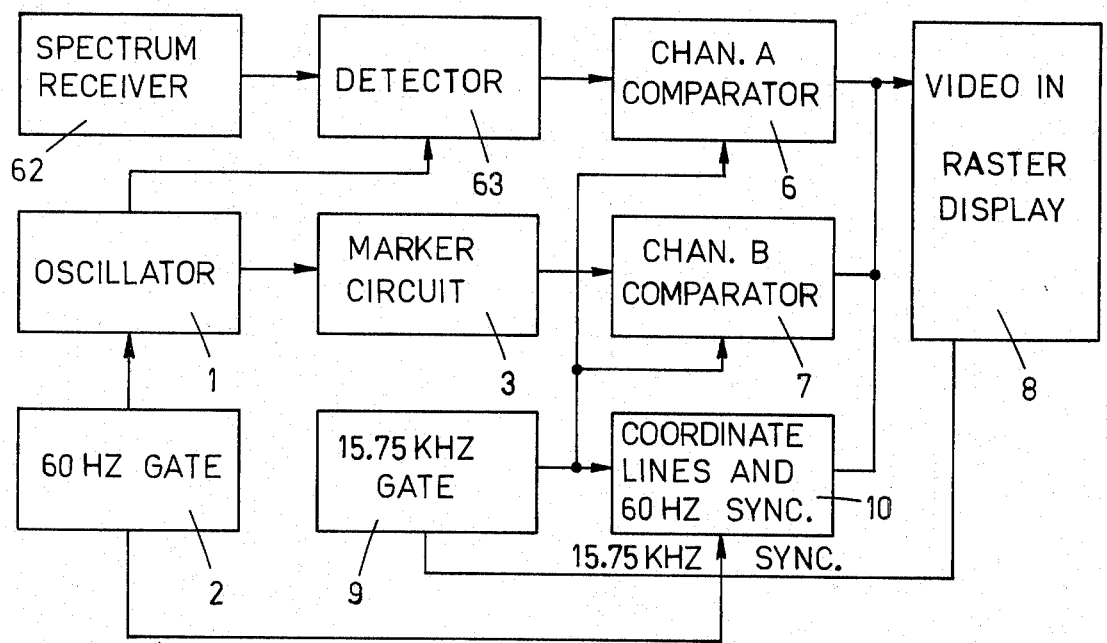
FIG. 7 is a block diagram of a spectrum display system in accordance with this invention.

The second version of the invention is a spectrum display. This is shown by the block diagram FIG. 7. FIG. 7 is similar to FIG. 1 in many respects. A spectrum of signals is received by a signal detector, and heterodyned, by a local oscillator, to an intermediate frequency. All this is conventional and is indicated by block 62. (See Electronics world May 1965 issue "Spectrum Analyzers") The I.F. signal is fed to a conventional second detector 63 which is heterodyned by sweep signals from box 1. The output of second detector 63 is a time-varying signal with separate peaks corresponding to the separate signals in the received spectrum. All other blocks in FIG. 7 function as described for FIG. 1.

Figure 8:
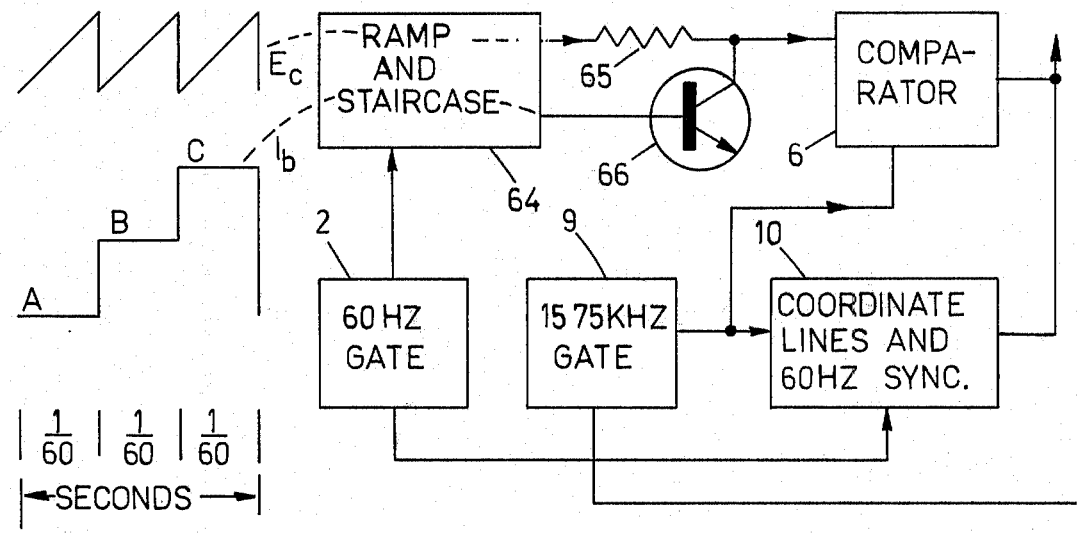
FIG. 8 is a block diagram of a curve tracer display system in accordance with this invention.
Figure 9:
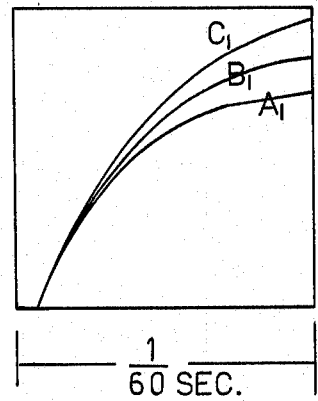
FIG. 9 is a representation of the display surface showing a family of curves for a transistor, developed by the device shown in FIG. 8.

The third version of the invention is a curve tracer display. This is shown in FIG. 8. Most of the blocks in FIG. 8 are the same as in FIG. 1. Block 64 represents a source that provides a voltage ramp $Ec$ and staircase current $Ib$. The ramp $Ec$ is applied through a resistor 65 to the collector of a transistor 66 which is to be tested. The staircase current $Ib$ is applied to the base of the transistor 66. A time-varying signal is developed at the collector of transistor 66 and this time-varying signal is displayed as described for FIG. 1. During one frame of the display, the staircase $Ib$ is at step $a$ while the ramp $Ec$ completes a cycle. During step $a$ a curve is traced on the display. This is shown at $a$ in FIG. 9. During the next step $b$ of the staircase $Ec$ a second curve is developed and displayed as in $b$ FIG. 9. Similarly a third curve $c$ is produced during step $c$ of $Ec$. These three curves $a$ $b$ $c$ are repeated on the display and due to retention of vision appear simultaneously.

Figure 10:
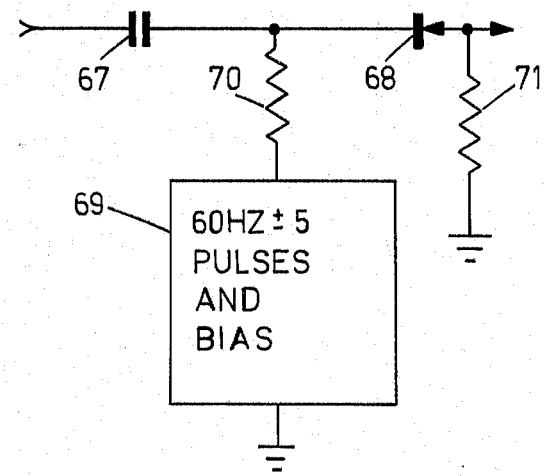
FIG. 10 is a detail schematic of an auxiliary circuit for displaying low frequency signals on the device shown in FIG. 1.

An auxiliary circuit as shown in FIG. 10. This will provide means to display low frequency signals. A diode switching circuit is used to control the video pulses from the comparator to the display means. These pulses are of one polarity. In this FIG. 10 it is assumed that the pulses are negative. The video pulse path is through capacitor 67 and diode 68. Normally the bias supply in box 69 supplies a positive voltage to the cathode of diode 68. This prevents conduction and the video pulses do not reach the display. Box 69 is also a source of negative pulses at an adjustable frequency. First adjust the pulse frequency from 69 to synchronize with the frame repetition frequency. Once each frame a negative pulse from box 69 will be applied through resistor 70 to the cathode of diode 68. The diode will become conductive for the duration of the negative pulse. This will permit video signals to reach the display means. This will happen at the same phase in each frame of the display and a stationary dot will appear on the display. Next adjust the pulse frequency from 69 slightly lower than the frame frequency. The dot on the display will move slowly orthogonal to the scanlines. If the box 69 frequency is adjusted slightly higher the dot can be made to move in the reverse direction. Now adjust the box 69 frequency so that the display dot traverses the screen once every 6 seconds. At the same time apply a time-varying signal at 70 cycles per minute to the comparator input. During each traverse of the screen, the moving dot will trace out seven cycles of the time-varying waveform. Resistor 71 in FIG. 10 is used to complete the pulse DC path. To assure coincidence between a video pulse each frame, each pulse from box 69 should cause diode 68 to be conductive for a period equal to the duration of one scanline.

Figure 11:
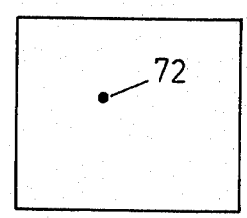
FIG. 11 is a representation of the display surface showing the effect of the 60 ± 5 HZ gate in reducing the zero signal line to a slowly moving or stationary dot.

FIG. 11 shows a single dot display 72 as created by the circuit of FIG. 10.

Figure 12:
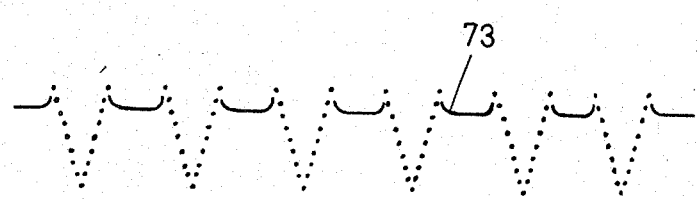
FIG. 12 is a representation of a 6 second exposure photograph of the display screen when the auxiliary circuit of FIG. 10 is used.

FIG. 12 is a representation of the display screen when the auxiliary circuit of FIG. 10 is used to display simulated heart-beat signals 73.

USE OF TYPICAL NUMERICAL VALUES AND POLARITIES

In the foregoing description, the explanations have frequently been simplified by using convenient but not necessarily restrictive numerical values. It is obvious that the invention will be operative over a wide range of values. The display device need not have a television screen, but could use any raster scanning device. The polarity of the pulses developed for application to the display screen is not limited to the examples described. In FIGS. 5 and 6 it is seen that the displays 56, 61 and co-ordinate lines 55 are shown as bright traces. The raster scanlines 53 are shown subdued and the co-ordinate lines 54 are black. The co-ordinate lines 54 are parallel to the scanlines. Because the scanlines are apparently moving at right angle to their lengths, this could introduce a flicker in the co-ordinate lines. This flicker disappears when the background scanlines are subdued.

CONCLUSION

In summary this invention relates to improvements in means for displaying time-varying signals on a raster-scanned display acted upon by a scanning comparator.

To avoid awkward phraseology and redundancy, these terms are defined here:

A raster-scanned display is a display means of the type producing images on a display surface by selectively writing on the display surface while repeatedly sweeping a scanline pattern across the display surface in a direction orthogonal to the direction of writing.

A frame of the display is the writing and scanning that occurs during one complete pattern of the scanning.

A scanning comparator is a comparison means including; means for receiving a time-varying signal; means for creating a ramp signal having a shape similar to the visual shape of the raster scanlines; means for synchronizing each cycle of the ramp signal with each succeeding raster scanline; means for comparing the time-varying signal with the ramp signal and initiating a pulse each time the instantaneous value of the ramp signal reaches a specific ratio to the time-varying signal.

The improvements include means to improve the clarity of the display; means to measure the co-ordinate values of a curve displayed in graph form; means for displaying low frequency signals, means to display physical characteristics and a simplifying type of scanning comparator.

Since the scanning comparator can use several family-related devices, this family is defined as the unijunction family including:
unijunction, standard
unijunction, complementary
unijunction, programmable
unijunction, pair of complementary transistors connected to function as a unijunction.

The structure of many of the devices referred to generally in the drawings and specification are commonly known from the following Prior Art.

Boxes 62 and 63, Spectrum Receiver and 2nd. Detector respectively. See
"Wide Range Analyzer" ELECTRONICS March, 1957.
"Spectrum Analyzers" ELECTRONICS June 21, 1963, p. 44.
"Phase Locked Marker" ELECTRONICS Feb. 7, 1966
"Spectrum Analyzers" ELECTRONICS WORLD May, 1965.
U.S. Pat. No. 2,996,667 — R. R. Galbreath.

Box 64, Ramp and Staircase Source. See "ELECTRONIC COMPONENTS AND MEASUREMENTS" Wedlock and Roberge, pp. 65 – 72, (Library of Congress 69 — 15046. Also "Transistor Curve Tracer" ELECTRONICS WORLD August 1971 and September 1965.

FIG. 3. See "Bipolar Transistor Pair Simulate Unijunction" ELECTRONICS Jan. 24, 1974 and Mar. 8, 1965.

What is claimed is:

1. Apparatus for displaying a time-varying signal on a raster-scanned display using in combination:
 means for creating a ramp signal having an electrical waveform similar to the visual shape of the raster scanlines of said display;
 means for synchronizing each cycle of said ramp signal with each succeeding raster scanline;
 a member of the unijunction family having two input terminals connected separately to said time-varying signal and said ramp signal;
 means to connect suitable voltages to the additional terminals of the unijunction device to make it operate as a unijunction;
 means to develop a signal when current flows in the unijunction device;
 means to connect the signal developed by the unijunction device to the raster-scanned display.

2. Apparatus for displaying a time-varying signal as claimed in claim 1 simultaneously with co-ordinate lines orthogonal to the direction of writing the display, including in combination:

a free-running oscillator producing electrical pulses at a rate approximately equal to an integral multiple of the frame rate of the raster-scanning pattern;

means for stopping the free-running oscillator for a short interval at the end of each frame of the raster-scanning pattern;

means to connect the pulses from the free-running oscillator to the raster-scanned display.

3. Apparatus for displaying a time-varying signal as claimed in claim 1 simultaneously with co-ordinate lines parallel to the direction of writing the display, including in combination:

a free-running oscillator producing electrical pulses at a rate approximately equal to an integral multiple of the raster scanline frequency;

means for stopping the last-mentioned oscillator for a short interval at the end of each raster scanline;

means to connect the pulses from the last-mentioned oscillator to the raster-scanned display.

4. Apparatus for displaying a first time-varying signal as claimed in claim 1 simultaneously with a second time-varying signal on a common raster-scanned display, where the first time-varying signal represents the resonance curve of a tuned circuit and the second time-varying signal indicates selected frequencies in the response range of the tuned circuit using in combination:

means for developing the first time-varying signal including;

means for producing a ramp signal with the start of each cycle of the ramp coinciding with the start of each frame of the raster-scanned display;

means for producing an auxiliary signal which is frequency-modulated by the last-mentioned ramp signal;

a tuned circuit of which the resonance curve is to be displayed;

means to feed a portion of the frequency-modulated signal to the tuned circuit;

means, including a signal detector to feed the output of the tuned circuit to the unijunction device in claim 1 at its time-varying signal terminal;

means for developing the second time-varying signal and processing it for display, including;

a second duplicate set of all means in claim 1;

means to feed a portion of the frequency-modulated signal to a frequency selective circuit having means to develop indicator signals to selected frequencies when acted upon by the frequency modulated signal;

means to feed the indicator signals to the time-varying signal terminal of the second unijunction device.

5. Apparatus for displaying a first time-varying signal as claimed in claim 4 simultaneously with a second time-varying signal on a common raster-scanned display, where the first time-varying signal represents a selected frequency segment of the resonance curve of a tuned circuit and the second time-varying signal indicates selected frequencies in the response range of the tuned circuit, using in combination:

means to stop the frequency-modulated signal from acting upon the tuned circuit the response curve of which was being displayed;

means to gate on the frequency-modulated signal to said tuned circuit for a selectable short period during each frame of the raster scanning pattern.

6. Apparatus for displaying a time-varying signal as claimed in claim 1 where the time-varying signal represents a spectrum of signals, using in combination:

means for receiving a spectrum of signals;

means for producing a second ramp shaped signal with the start of each ramp cycle coinciding with the start of each frame of the raster-scanned display;

means for producing an auxiliary signal which is frequency-modulated by said ramp signal; 'a heterodyne detector to which is coupled the said spectrum of signals and said frequency-modulated signal;

means for connecting the heterodyne detector output of the time-varying terminal of the unijunction device.

7. Apparatus for displaying a time-varying signal as claimed in claim 1 where the time-varying signal represents a family of characteristic curves of a non-linear conducting device, including in combination:

means for producing a second ramp-shaped signal with the start of each ramp cycle coinciding with the start of each frame of the raster-scanned display;

means for producing a staircase-shaped signal with the period of successive steps of the staircase coinciding with successive periods of said second ramp signal;

means for feeding aportion of the staircase signal to a first terminal of a non-linear device to be tested;

means for feeding a portion of said second ramp signal to a second terminal of said non-linear device;

means connected to such other terminals of the said non-linear device to make it operate in a desired manner;

a resistor in series with one terminal of said non-linear device and means to connect the common point of the resistor and the non-linear device to the time-varying terminal of the unijunction device.

8. Apparatus for displaying a time-varying signal as claimed in claim 1 where the time-varying signal is of very low frequency, including in combination:

an auxiliary source of electrical pulses having a frequency adjustable within several cycles per second below to several cycles per second above the frame rate of the raster-scanning pattern;

means for stopping the flow of pulses from the unijunction device to the raster-scanned display;

means for gating on the pulses from the unijunction device to the raster-scanned display by each of the pulses from said auxiliary source.

* * * * *